Figure 1:
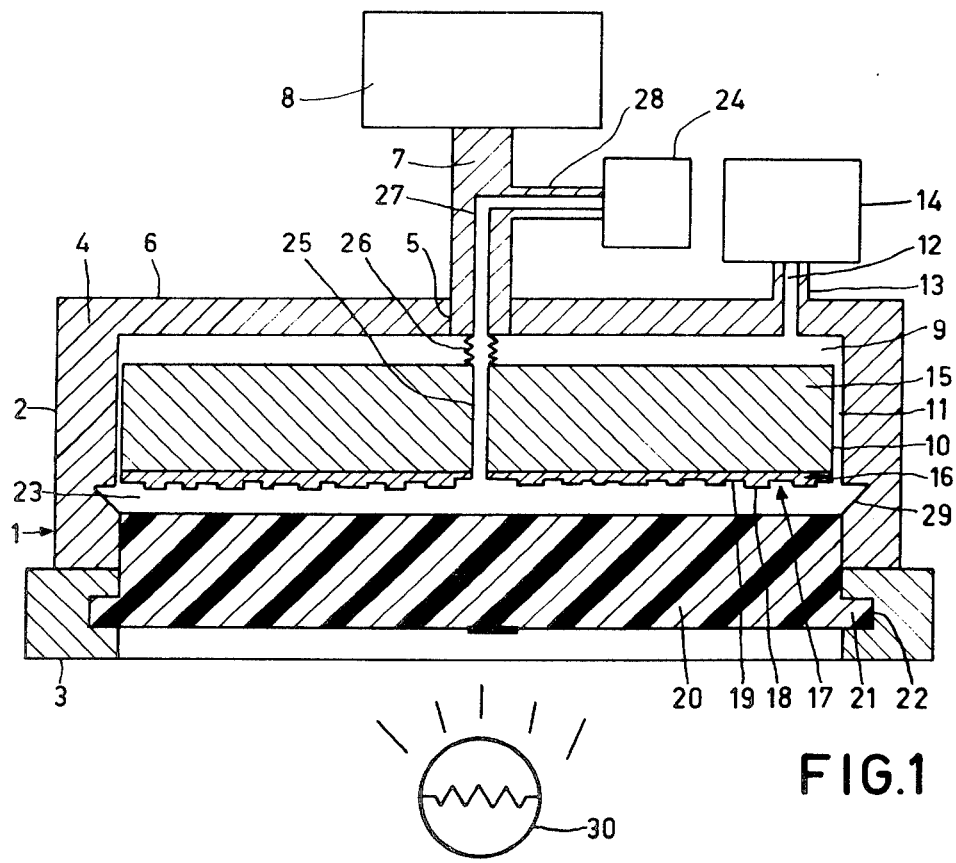

United States Patent [19]

Broeksema et al.

[11] Patent Number: 4,477,328
[45] Date of Patent: Oct. 16, 1984

[54] OPTICALLY READABLE INFORMATION DISK AND METHOD OF MANUFACTURING SAME

[75] Inventors: Egbert Broeksema; Arnoldus A. Smeets, both of Eindhoven, Netherlands

[73] Assignee: U.S. Philips Corporation, New York, N.Y.

[21] Appl. No.: 354,830

[22] Filed: Mar. 4, 1982

Related U.S. Application Data

[63] Continuation of Ser. No. 102,203, Dec. 10, 1979, abandoned.

[30] Foreign Application Priority Data

May 25, 1979 [NL] Netherlands ............... 7904113

[51] Int. Cl.³ .................. C08F 2/50; G11B 23/00; G11B 7/26; G11B 7/24
[52] U.S. Cl. .................. 204/159.23; 264/1.4; 264/2.2; 264/107; 264/22; 369/19; 369/275
[58] Field of Search .................. 264/1.4, 107, 2.2; 204/159.23; 369/275, 19

[56] References Cited

U.S. PATENT DOCUMENTS

| | | | |
|---|---|---|---|
| 3,658,954 | 4/1972 | Broadbent | 264/1 |
| 3,935,292 | 1/1976 | Okubo et al. | 264/1.4 |
| 4,041,530 | 8/1977 | Kramer et al. | 369/109 |
| 4,057,831 | 11/1977 | Jacobs et al. | 428/64 |
| 4,130,620 | 12/1978 | Jarsen | 264/310 |
| 4,154,896 | 5/1979 | Sattler et al. | 204/159.15 |
| 4,157,931 | 6/1979 | Bricot et al. | 264/106 |
| 4,188,433 | 2/1980 | Dijkstra et al. | 428/64 |
| 4,275,091 | 6/1981 | Lippits et al. | 427/53.1 |
| 4,312,823 | 1/1982 | Kraakman et al. | 264/107 |

FOREIGN PATENT DOCUMENTS

7611395 4/1978 Netherlands .
1579709 11/1980 United Kingdom .
1579710 11/1980 United Kingdom .

Primary Examiner—John C. Bleutge
Assistant Examiner—Arthur H. Koeckert
Attorney, Agent, or Firm—Norman N. Spain

[57] ABSTRACT

The invention relates to an optically readable information disk, a method of manufacturing same, as well as a device for carrying out the method, in which the information disk which comprises an optically readable information track of information areas situated at a higher and a lower level, is manufactured entirely from a radiation-cured layer of a lacquer containing oligomeric acrylates or methacrylates which on an average per molecule comprise between one and four acrylate groups or methacrylate groups, has a viscosity of 1,000–15,000 cP and comprises a photoinitiator in a concentration of 0.1 to 0.5% by weight. Suitable lacquers comprise notably 1,1'-isopropylene-bis(p-phenoxyethylmethacrylate) or 1,1'-isopropylene-bis(p-phenoxyethylacrylate).

7 Claims, 4 Drawing Figures

OPTICALLY READABLE INFORMATION DISK AND METHOD OF MANUFACTURING SAME

This is a continuation of application Ser. No. 102,203, filed Dec. 10, 1979 now abandoned.

The invention relates to an optically readable information disk which comprises a substrate manufactured from a synthetic resin which is provided with a radiation-cured synthetic resin liquid composition layer which comprises an optically readable information track having a relief structure of information areas situated alternately at a higher and a lower level.

Such an information disk which may comprise audio or video information is disclosed in Applicants' Netherlands patent application No. 76.11395 laid open to public inspection.

The information disk described in the said Netherlands patent application has a laminated structure which is manufactured by providing a thin, radiation curable synthetic resin liquid composition over the surface of a metal matrix which comprises the information track. A substrate disk manufactured from a symthetic resin is placed on the resulting very thin liquid composition layer and the liquid composition is then cured via the substrate disk by means of radiation, for example ultraviolet light, after which the assembly of substrate disk and cured liquid composition layer connected thereto, and in which the information track is copied, is removed from the matrix surface.

The synthetic resin substrate plate or disk is manufactured from a thermoplastic synthetic resin, for example, polymethylmethacrylate. The thin liquid composition layer has a viscosity of at most 100 cP, for example 1–10 cP, and preferably consists of at least 95% by weight of low molecular monomers having an average molecular weight of at most 400. The oligomers which may be present in the liquid composition generally have a slightly higher molecular weight of, for example, 500–2,000, as is stated on page 8 of the above-mentioned Netherlands patent application.

Although the known information disk has an excellent quality it has been found that in the long run a deterioration of the quality occurs, in particular when the disk is stored or used in moist circumstances and/or at high temperatures, so that the stored information can no longer be optically read or displayed.

It is the object of the present invention to provide an optically readable information disk of the type mentioned in the opening paragraph which is less sensitive to moisture and heat, has a longer life and can furthermore be manufactured in a simple and cheap manner.

According to the invention these objects are achieved with an information disk of the above-mentioned type which is characterized in that both the substrate and the synthetic resin liquid composition layer are manufactured from the same radiation-cured liquid composition layer which comprises oligomeric acrylates or methacrylates which on an average per molecule comprise between one and four acrylate groups or methacrylate groups, has a viscosity of 1,000–15,000 cP and is provided with a photoinitiator in a concentration of 0.1 to 0.5% by weight.

The information disk according to the invention does not have a laminated structure but forms one assembly both chemically and physically. The disk is therefore manufactured as one assembly in a one-step-process.

The information track present in the surface of the disk has a crenellated profile of information areas of very small dimensions situated alternately at a higher and a lower level. The longitudinal dimensions of the information areas vary in agreement with the stored information and are roughly from 0.3 to 3 $\mu$m. The level difference between the areas is in the order of magnitude of tenth parts of a $\mu$m, for example 0.2–0.3 $\mu$m.

The information track is preferably read in reflection by means of laser light and also preferably through the body of the information disk. Reading through the body of the information disk has the advantage that the dust particles or scratches present on the surface of the disk fall beyond the depth of focus of the objective which focuses the reading laser light on the information track. Such contaminations then have no adverse influence on the quality of the information read. Reading in reflection presents the advantage that fewer optical elements, for example objectives, are necessary because the forward and reflected laser light beam follow the same optical path to a considerable extent. The information track is read on the basis of phase differences which occur between the forward and reflected laser light beam. The phase differences vary in magnitude in accordance with the fact whether an information area is exposed which is situated at a higher or at a lower level. The level difference is preferably one quarter of a wavelength of the laser light with which is read. For reading in reflection the surface of the information disk comprising the information track is covered with a reflecting metal layer, for example a silver layer or a layer of aluminum, which can be provided in a very small layer thickness of, for example, 30 nm by means of a vapour deposition process, a sputtering process or a dipping process.

The radiation-curable liquid composition comprising oligomeric acrylates or methacrylates from which the information disk is manufactured is transparent to the radiation used in curing, for example ultraviolet light, and, after curing, to the laser light with which the information disk is read.

Thus, liquid composition polymerizes rapidly, even at low temperatures, such as room temperature, and gives a very homogeneous cross-linking of the oligomeric substances present. Also as a result of this, the information disk has comparatively little interfering internal stresses and furthermore does not show any noticeable birefringence in the direction of reading. Also in the longer run the information disk does not show any deformations and no local differences in coefficients of expansion occur as a result of variable moisture or temperature conditions.

The liquid composition comprising oligomeric acrylates or methacrylates employed has a very good resolving power. This is to be understood to mean that it is possible to accurately provide very refined and detailed information in the form of the above-mentioned information areas in the surface of the liquid composition. In this connection it is to be noted that the information track is provided by disposing the liquid composition in the desired layer thickness on the surface of a matrix, for example a nickel matrix, the surface of the matrix having the information track to be copied by the liquid composition. The lacquer very accurately followx the profile of the matrix surface. The liquid composition is then cured by radiation, for example ultraviolet light, and the resulting cured information disk in which the information track has been copied is finally removed from the matrix surface. This manufacturing process will be described hereinafter.

The information disk according to the invention has a thickness in the order of magnitude of 0.5 to 3 mm and is a mechanically rigid and strong product which shows a good resistance to scratches. The disk is resistent to temperature and moisture.

An advantage of the homogeneous composition of the information disk according to the invention is that there are no adhesion problems whatsever which may occur between the substrate plate and the information layer of the above-described known information disk, as a result of a difference in expansion between substrate plate and information layer.

The photoinitiator used in the liquid composition is of a conventional type. The composition thereof depends on the type of radiation used in the polymerisation of the lacquer. When ultraviolet light is used, for example, an aromatic carbonyl compound, in particular a benzoin derivative, for example benzoin isobutylether, may be used. In a visible light-curable liquid composition comprising of oligomeric acrylates or methacrylates, a xanthene dye, for example erythrosine, may be used as a photoinitiator.

Preferably a sensitizer is incorporated in the radiation-curable liquid composition in addition to the photoinitiator. The sensitizer absorbs the radiation with which the liquid composition is cured and transfers the absorbed energy to the photoinitiator which forms radicals with which the polymerisation of the acrylates or methacrylates is initiated. The use of a sensitizer, for example an amine, in particular an ethanolamine, for example dimethylaminoethanol, furthermore has a flexibilizing effect. This means that a less brittle product is obtained. Furthermore, the oxygen inhibition is reduced by the sensitizer. The quantity of sensitizer is roughly from 0.1 to 0.5% by weight.

Preferably the liquid composition also comprises a copolymerisable tertiary amine, for example, an aminoacylate having a molecular weight of approximately 200–600. A suitable aminoacrylate notably is the aminoacrylate product known by the tradename Uvecryl. Such a copolymerising material has a sensitizing effect and accelerates the polymerisation reaction. Furthermore, by using a copolymerisable tertiary amine a more flexible final product, that is to say a less brittle product, having an even slightly improved moisture resistance, is obtained. The quantity of tertiary amine is at most 20% by weight and is preferably smaller than 10% by weight, for example 4–8% by weight.

The viscosity of the radiation-curable liquid composition comprising oligomeric acrylates or methacrylates is between 1,000 and 15,000 cP at 20° C. Good results are obtained more in particular with a liquid composition the viscosity of which at 20° C. is 1,100–5,000 cP, for example 2,500 cP.

In a preferred form of the information disk according to the invention, a radiation-cured layer of a liquid composition is used which contains oligomeric acrylates or methacylates having an average molecular weight of 300–1,000. The content of oligomeric acrylates or methacrylates is preferably at least 90% by weight. In addition to the required mechanical rigidity and strength, an information disk based on this liquid composition has a sufficient flexibility to be able to cope with the normal forces possibly occurring in manipulating the disk with a fair chance of no fracture occurring.

In a preferred form of the disk according to the invention a radiation-cured layer is formed of a liquid composition which comprises at least 90% by weight of an epoxylated ar alkoxylated bisphenol and/or Novolak, each of which comprises on an average between 1 and 3 acrylate groups or methacrylate groups per molecule. The average number of acrylate groups or methacrylate groups per molecule is preferably 1.5–2.5. Epoxylated or alkoxylated bisphenol compounds and Novolak compounds are sufficiently known from literature. Reference is made by way of example to "Handbook of Fiberglass and Advanced Plastics Composites, George Labin, edited by Nostrand, Rheinhold Co., New-York (1969) Chapter 3, pp. 46–84.

Good information disks are obtained in particular when the liquid composition comprises at least 90% by weight of an alkylene-bis (phenoxyalkylacrylate) or alkylene-bis (phenoxyalkylmethacrylate). This applies in particular to a liquid composition which consists at least for 90% by weight of 1,1'-isopropylene-bis(p-phenoxyethylacrylate) or 1,1'-isopropylene-bis(p-phenoxyethylmethacrylate). The above-mentioned methacrylate compound is commercially available under the registered tradename Diacryl 101 and has the formula

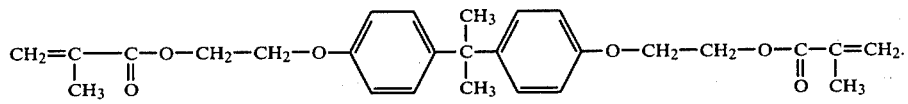

The substance has a molecular weight of 452 and at 20° C. has a viscosity of 2,500 cP.

The above-mentioned acrylate compound is available under the tradename Setalux UV 2246 and has the formula

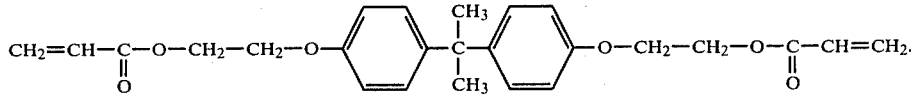

This substance has a viscosity of roughly 10,000 cP at 20° C.

In addition to the phenoxyalkylacrylate or -methacrylate compound the liquid composition may comprise at most 5% by weight of an oligomeric polyester or polyurethane acrylate or methacrylate which contains per molecule on an average between 1 and 3 acrylate groups or methacrylate groups.

The optically readable information disk of the invention can also be produced in the so-called double construction. For this purpose, two information disks each comprising a reflective layer on the side of the information track are combined to form one assembly by interconnecting the disks facing each other with their reflective surfaces by means of a glue, if desired with the interposition of one or several annular spacing members.

The invention also relates to a method of manufacturing an optically readable information disk as described hereinbefore which method is characterized in that a radiation-curable liquid composition comprising oligomeric acrylates or methacylates which on an average comprise per molecule between 1 and 4 acrylate groups or methacrylate groups, which liquid composition has a viscosity of 1,000–15,000 cP and is provided with a photoinitiator in a concentration of 0.1 to 0.5% by weight is introduced into a moulding cavity formed between two parallel arranged matrices, at least one of the two matrices on its surface facing the other matrix comprising an information track having a relief structure of information areas situated alternately at a higher and a lower level. The liquid composition introduced between the two matrices is then cured by radiation via one or both matrices and the resulting cured disk in which the information track has been copied is removed after opening the matrices and, if desired, is provided with a reflective layer on the side of the information track.

A favourable embodiment of the method according to the invention is characterized in that one of the two matrices can be displaced, the matrix, during the shrinkage of the lacquer occurring upon curing, remaining adhered to the surface of the lacquer layer and, under the influence of the shrinkage forces exerted on the matrix, moving without deformation in a direction perpendicular to the matrix surface, so that as a result of this the shrinkage of the lacquer layer results exclusively or substantially exclusively in a dimension variation of the lacquer layer in a direction perpendicular to the surface of the matrices.

With this favourable embodiment it is achieved that the dimensions of the information track formed in the surface of the lacquer do not vary or only in a non-noticeable manner during the shrinkage of the liquid composition upon curing.

The invention furthermore relates to a device for carrying out the above-described method characterized in that the device comprises a divisible substantially cylindrical housing, two parallel arranged and substantially cylindrical matrix parts in the housing, one of the two matrix parts being movable relative to the other matrix part in a direction perpendicular to the surface thereof, a moulding cavity between the two matrix parts which via a first aperture in the housing communicates with a supply device for a radiation-curable lacquer and, via a second aperture in the housing, communicates with a double acting pump, the surface of at least one matrix part facing the moulding cavity comprising an information track of information areas situated alternately at a higher and a lower level, as well as a source of radiation.

Figure 3:
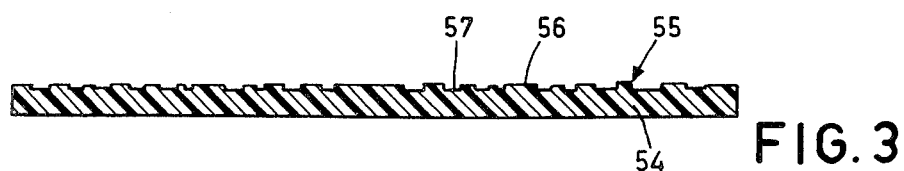
Figure 4:
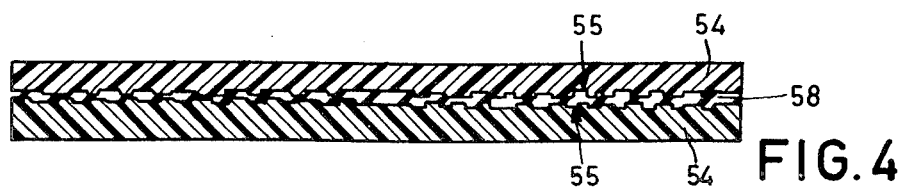
Figure 2:
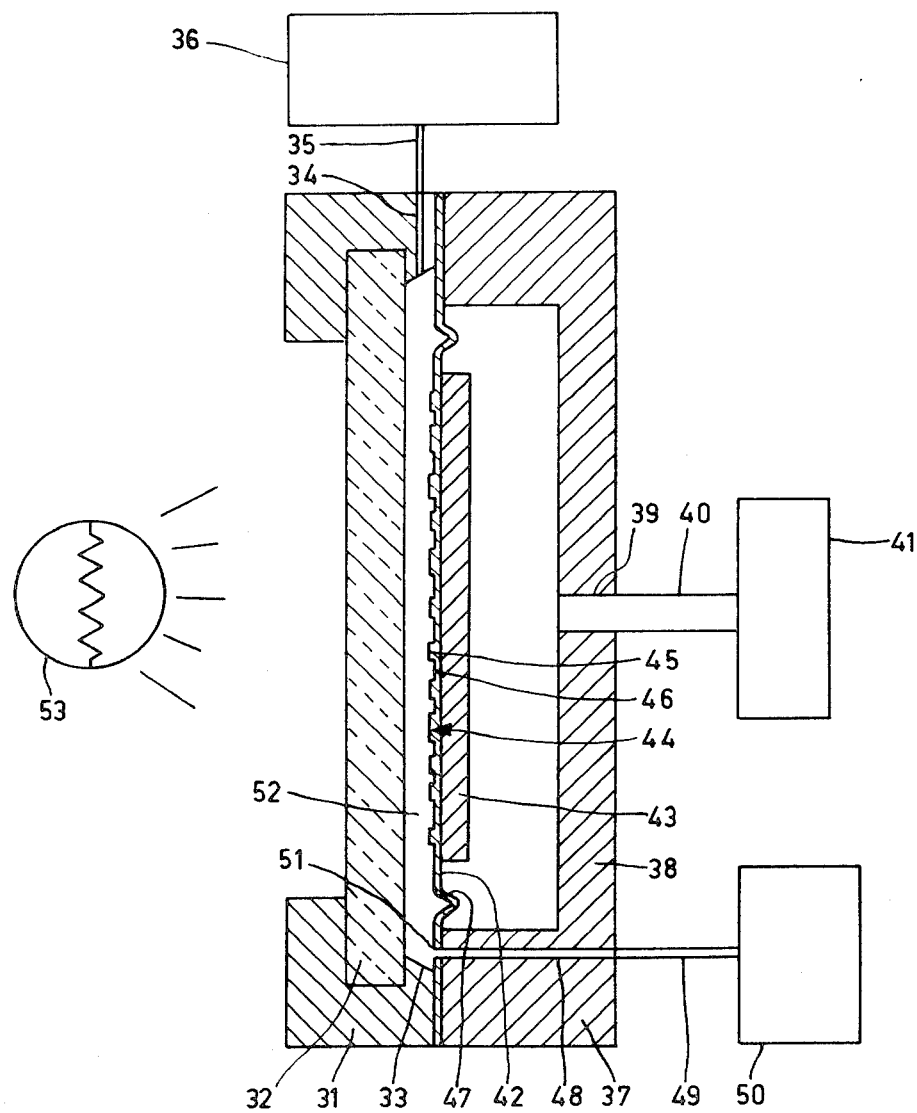

The invention will now be described in greater detail with reference to the drawing, in which FIG. 1 is a diagrammatic cross-sectional view of the device according to the invention, FIG. 2 is a diagrammatic cross-sectional view of another embodiment of the device according to the invention, FIG. 3 is a tangential sectional view of an information disk according to the invention, and FIG. 4 is a tangential cross-sectional view of the double construction of the information disk according to the invention.

Reference numeral 1 in FIG. 1 denotes a divisible housing comprising a metal head 2 as well as an annular and divisible supporting plate 3 likewise manufactured from metal. The head 2 comprises a cylindrical body 4 and a cover plate 6 which has a central aperture 5 and is connected to the shaft 7 of a linear motor 8 extending in the aperture 5. A cylindrical first matrix part 10 is incorporated in the space 9 enclosed by the body 4. A slot-shaped cylindrical space 11 is present between the body 4 and matrix part 10. The spaces 9 and 11 are connected, via a connection nipple 13 having a central bore 12, to a double acting pump 14 connected to nipple 13.

Matrix part 10 comprises a matrix holder 15 which is manufactured from metal and a metal matrix 16 which is connected thereto and which, at the surface remote from the holder 15, has an information track 17 which has a relief structure of information areas 18 situated at a higher level and information areas 19 situated at a lower level.

A substantially cylindrical second matrix part 20 which is manufactured from glass or a transparent synthetic resin, for example, polymethylmethacrylate, is secured in the supporting plate 3 so as to be detachable. For this purpose, the matrix part 20 has a circumferential ridge 21 which fits in groove 22 of a divisible supporting plate 3.

First and second matrix parts (10 and 20, respectively) are positioned mutually in parallel and enclose a moulding cavity 23. Moulding cavity 23 communicates with a supply device 24 containing of a radiation-curable liquid composition, via a central bore 25 in matrix part 10, a flexible connecting piece 26 and a bore 27 in shaft 7 of motor 8, which latter bore opens into a nipple 28 which is provided transversely to the shaft 7 and which acommunicates with the said supply device 24.

At the level of the moulding cavity 23 the cylindrical body 4 has a circumferential internal groove 29. Moulding cavity 23 can be exposed to ultraviolet light originating from a light source 30 via the transparent matrix part 30.

The operation of the device is as follows.

The head 2 is closed under the influence of linear motor 8, cylindrical body 4 of head 2 engaging the supporting plate 3. Matrix part 10 with matrix 16 engages the upper surface of the second matrix part 20. Under the influence of the double acting pump 14 the spaces 9, 11 and 23 enclosed by body 4 are evacuated, after which an ultraviolet light-curable liquid composition is introduced via bore 27, connection piece 26 and bore 25 into the moulding cavity 23 present between the matrix part 10 and the matrix part 20. The liquid composition has a temperature of 50° C., a viscosity of 300 cP and the following composition:

99% by weight of 1,1'-isopropylene-bis(p-phenoxyethylmethacrylate), 0.5% by weight of 2,2-dimethoxy-2-phenylacetophenone (photoinitiator), 0.5% by weight of dimethylaminoethanol.

As a result of the supply of the liquid composition, matrix holder 15 and the matrix connected thereto will be pushed upwards and a layer of liquid composition will be built up in the moulding cavity 23. The ultimate thickness of the intoduced layer of liquid composition depends on the quantity of liquid composition employed and is between 0.1 and 3 mm.

After the desired quantity of the liquid composition has been added, compressed air is introduced in the space 9 via duct 12 by means of the double acting pump 14. Also as a result of this, a uniform pressure will be exerted on the layer of the liquid composition present in the moulding cavity 23 by matrix part 10. This liquid composition is exposed to ultraviolet light originating from a high pressure mercury lamp 30, type Philips HPM 12 having a power of 10 mW/cm$^1$ with an emission wavelength of 365 nm via the transparent matrix part 20 for 1-2 minutes.

The liquid composition polymerizes under the influence of the ultraviolet light. During polymerisation the layer of liquid composition shrinks. Matrix 16 during the shrinkage remains adhered to the surface of the liquid composition layer, matrix 16 and the matrix holder 15 connected thereto moving, during the shrinkage, in a direction perpendicular to the surface of the matrix part 10. As a result of this, the shrinkage results only in a dimensional variation of the liquid composition layer in the direction perpendicular to matrix part 10. The information track present in the surface of the liquid composition layer shows little or no change in shape during the polymerisation of the liquid composition layer. After polymerisation of the liquid composition, the compressed air is removed29 present in the body 4, the cured liquid composition layer and the matrix holder 15 with the matrix 16 will also be raised when the head 2 is raised, the cured liquid composition layer being thus separated from the surface of the second matrix part 20. Space 9 is evacuated a little by means of double acting pump 14, so that matrix holder 15 with matrix 16 are raised inside the cylindrical body 4. The disk-shaped cured liquid composition layer which comprises on one side the information track copied from matrix 16 (see FIG. 3) cannot follow this upward movement due to the larger diameter and is thus separated from matrix 16. Compressed air is then applied by means of double acting pump 14 via spaces 12, 9 and 11 to the space formed between the matrix part 16 and the disk-shaped cured liquid composition layer so that the cured liquid composition layer disk is bubbled down and is ejected from the cylindrical body 4 as a result of the reduced diameter. The resulting information disk (see FIG. 3) is finally provided with a reflective metal layer on the side of the information track (FIG. 3).

Reference numeral 31 in FIG. 2 denotes a metal holder for a glass disk 32. Glass disk 32 has a thickness of 5 mm. Holder 31 has a U-shaped profile, the end face of which 33 being slightly bevelled and enclosing an angle of approximately 5° with the horizontal. Holder 31 furthermore comprises an aperture 34 which opens into the said end face 33 and communicates with a supply device 36 for a radiation-curable liquid composition via connecting duct 35. Reference numeral 37 denotes a second holder manufactured from metal which is substantially cylindrical and has a cover plate 38 in which an aperture 39 is provided through which shaft 40 of a linear motor 41 is inserted. The annular end face of holder 37 remote from the cover plate 38 has a matrix 42 which is centrally provided with a matrix support 43 which has a thickness of approximately 6 mm. At the surface of matrix 42 remote from the support 43 an information track 44 is provided which has a relief structure of information areas 45 situated at a higher level and information areas 46 situated at a lower level.

The information areas have longitudinal dimensions which vary from approximately 0.3 to 3 μm. The difference in height is approximately 0.2-0.3 μm. The part of matrix 42 situated outside matrix support 48 has a ridge 47 having a depth of approximately 0.1 mm. The result of the presence of ridge 47 is that the part of matrix 42 having the information track 44 together with matrix support 43 is flexible and can be moved over a distance of approximately 50 μm with respect to holder 37. Holder 37 comprises an aperture 48 which communicates via connecting piece 49 with a double acting pump 50. At the area of the aperture 48, matrix 42 has an aperture 51. Holder 37 can be moved by means of linear motor 41, in which, in the operating position of holder 37 shown in the drawing, the part of matrix 42 connected to the end face of holder 37 is clamped against holder 31 and between the matrix 42 and the glass plate 32 connected to holder 31 a moulding cavity 52 is formed which has a depth of 1.1 mm. Moulding cavity 52 can be exposed via glass plate 32 to ultraviolet light which originates from light source 53.

The operation of this device is as follows.

There is started from the operating position shown in the drawing in which the part of matrix 42 connected to holder 37 engages holder 31. The moulding cavity 52 is evacuated by means of double acting pump 50 and the moulding cavity is then filled with an ultraviolet light-curable liquid composition of the following composition:

96.75% by weight of 1,1'-isopropylene-bis(p-phenoxyethylacrylate), 0.25% by weight of isopropylbenzoinether, 3% by weight of aminocrylate (trade name Uvecryl P 104).

The liquid composition which originates from supply device 36 has a temperature of 50° C. and a viscosity of 300 cP. The liquid composition layer present in cavity 52 is exposed to ultraviolet light for 1 minute, which light originates from light source 53, in this case a high pressure mercury lamp, type Philips HPM 12, having a power of 10 mW/cm$^2$. During the exposure the liquid composition layer cures and shrinkage also occurs. During the shrinkage the matrix 42 remains adhered to the surface of the cured liquid composition layer and also moves with the supporting plate 43 under the influence of the shrinkage forces over a distance of 50 μm in the direction of glass plate 32. The information track copied in the lacquer layer by matrix 42 shows no dimension variations during the shrinkage of the lacquer layer. After curing of the lacquer layer, holder 37 is moved to the right (in the drawing) by means of linear motor 41. The disk of cured lacquer present on the matrix 42 remains adhered to the surface of the matrix 42 during the movement of holder 37 and follows the movement of holder 37. The disk is detected from the glass plate 32 and is then removed from the surface of matrix 42. The information disk obtained in which the information track 44 of matrix 42 has been copied is finally provided with a reflective metal layer on its side of the information track.

Reference numeral 54 in FIG. 3 denotes a disk formed of a radiation-cured liquid composition obtained as described with reference to the description of FIG. 1. Disk 54 has a thickness of 1.1 mm and is provided on one side with an information track 55 having a relief structure of information areas 56 situated at a higher level and information areas 57 situated at a lower level. The longitudinal dimensions of information areas 56, 57 vary from 0.1 to 3 μm. The difference in level is 0.2–0.3 μm. Disk 43 is covered on the side of the information track 55 with a layer of Ag not shown in a thickness of 30 mm which is provided by means of a sputtering process.

FIG. 4 shows a double construction of the disk shown in FIG. 3. In FIG. 4 the same reference numerals are used for the same components as in FIG. 3. As shown in FIG. 4, two information disks (FIG. 3) have been combined to form one assembly, the composing disks 54 facing each other with their sides comprising the information track 55 and being connected together by means of glue 58.

What is claimed is:

1. A self supported optically readable information disk of radiation cured synthetic resin having a thickness of about 0.5–3 mm the surface of which disk comprises an optically readable information track having a relief structure of information areas situated alternatively at a higher and lower level and which disk is formed by the irradiation of a radiation curable liquid composition having a viscosity of 1000–15,000 cP and comprising oligomeric acrylates or methacrylates which on the average per molecule comprise between one to four acrylate or methacrylate groups and a photoinitiator in a concentration of 0.1 to 0.5 percent by weight.

2. An optically readable information disk as claimed in claim 1, characterized in that the oligomeric acrylate or methacrylate has an average molecular weight of 300–1,000.

3. An optically readable information disk as claimed in claim 1 or 2, characterized in that the lacquer comprises at least 90% by weight of an epoxylated or alkoxylated bisphenol and/or Novolak each comprising on an average per molecule between one and three acrylate groups or methacrylate groups.

4. An optically readable information disk as claimed in claim 3, characterized in that the lacquer comprises an alkylene-bis(phenoxyalkylmethacrylate) or an alkylene-bis(phenoxyalkylacrylate).

5. An optically readable information disk as claimed in claim 4, characterized in that the lacquer comprises 1,1'-isopropylene-bis(p-phenoxyethylmethacrylate) or 1,1'-isopropylene-bis-(p-phenoxyethylacrylate).

6. A method for manufacturing an optically readable information carrier, said information carrier being a self supported radiation cured synthetic resin disk, characterized in that a radiation-curable liquid composition which comprises oligomeric acrylates or methacrylates which on an average comprise per molecule between 1 and 4 acrylate groups or methacrylate groups, which liquid composition has a viscosity of 1,000–15,000 cP and comprises a photoinitiator in a concentration of 0.1 to 0.5% by weight, is introduced into a moulding cavity formed between two parallel arranged matrices, at least one of the two matrices on its surface facing the other matrix having an information track which has a relief structure of information areas situated alternately at a higher and a lower level, the introduced layer is then cured by radiation via one or both matrices and the resultant cured disk in which the information track has been copied is removed from the mold after opening the matrices and, if desired, is provided with a reflective layer on the side of the information track.

7. A method as claimed in claim 6, characterized in that one of the matrices is movable, in which the matrix, during the shrinkage of the liquid occurring upon curing, remains adhered to the surface of the liquid layer and, under the influence of the shrinkage forces exerted on the matrix, moves without deformation in a direction perpendicular to the matrix surface, so that as a result of this the shrinkage of the liquid layer results exclusively or substantially exclusively in a dimension variation of the liquid layer in a direction perpendicular to the surface of the matrices.

* * * * *